United States Patent
Halope

(10) Patent No.: US 6,851,618 B2
(45) Date of Patent: Feb. 8, 2005

(54) CONTACTLESS OR HYBRID CONTACT-CONTACTLESS SMART CARD WITH REINFORCED CONNECTION OF THE ELECTRONIC MODULE

(75) Inventor: Christophe Halope, Golfe Juan (FR)

(73) Assignee: ASK S.A., Valbonne (FR)

( * ) Notice: Subject to any disclaimer, the term of this patent is extended or adjusted under 35 U.S.C. 154(b) by 0 days.

(21) Appl. No.: 10/244,028

(22) Filed: Sep. 16, 2002

(65) Prior Publication Data

US 2003/0052177 A1 Mar. 20, 2003

(30) Foreign Application Priority Data

Sep. 14, 2001 (FR) .............................................. 01 11918
Feb. 20, 2002 (FR) .............................................. 02 02161

(51) Int. Cl.[7] ........................ G06K 19/06; G06K 19/00; G06K 19/02
(52) U.S. Cl. ........................ 235/492; 235/487; 235/488
(58) Field of Search .............................. 235/487, 488, 235/492; 361/737

(56) References Cited

U.S. PATENT DOCUMENTS

| 5,598,032 | A | * | 1/1997 | Fidalgo ...................... 257/679 |
| 5,888,624 | A | * | 3/1999 | Haghiri et al. ............... 428/195 |
| 5,969,951 | A | * | 10/1999 | Fischer et al. .............. 361/737 |
| 6,025,054 | A | * | 2/2000 | Tiffany, III .................. 428/189 |
| 6,173,898 | B1 | * | 1/2001 | Mande ........................ 235/488 |
| 2001/0002035 | A1 | * | 5/2001 | Kayanakis ................... 235/492 |
| 2001/0006194 | A1 | * | 7/2001 | Kayanakis et al. ......... 235/492 |
| 2001/0012682 | A1 | * | 8/2001 | Kayanakis et al. ......... 438/585 |

\* cited by examiner

*Primary Examiner*—Karl D. Frech
*Assistant Examiner*—April Taylor
(74) *Attorney, Agent, or Firm*—James C. Lydon

(57) ABSTRACT

A smart card including an antenna (18) on a support made of paper type fibrous material (12), two card bodies on each side of the support each consisting of at least one layer of plastic material having a low flow temperature, and an electronic module (26) featuring a chip connected to the antenna, the assembly made up of the antenna support and the two card bodies being welded together by hot-lamination under pressure. The support made of fibrous material includes at least one opening (14, 16) such that the plastic layers (23, 25) of the card body come into near perfect contact during the lamination operation, the opening forming a weld between the card bodies thus reinforcing the connection of the module.

9 Claims, 2 Drawing Sheets

Figure 1:
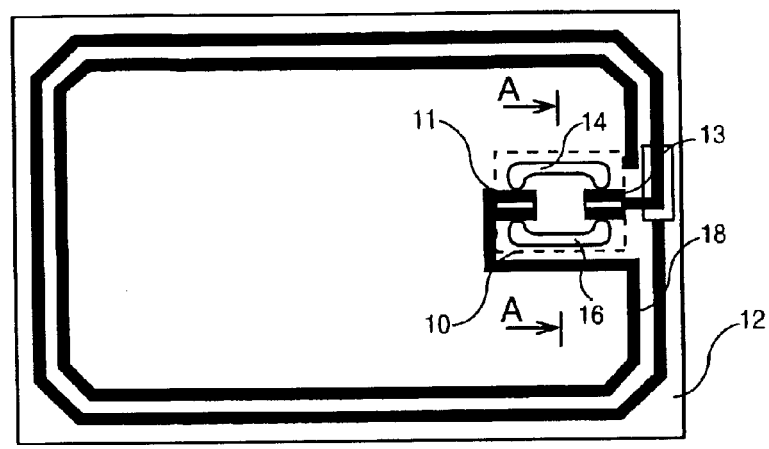

CONTACTLESS OR HYBRID CONTACT-CONTACTLESS SMART CARD WITH REINFORCED CONNECTION OF THE ELECTRONIC MODULE

This invention concerns contactless or hybrid contact-contactless smart cards and particularly a smart card of this type with a reinforced connection of the electronic module.

The contactless smart card is a system being used increasingly in various sectors. For example, in the transportation sector, smart cards have been developed as a means of access. The same holds true for the electronic wallet. Many companies have also developed identification systems for their personnel using contactless smart cards.

The exchange of information between a contactless card and the associated reader is accomplished by remote electromagnetic coupling between an antenna housed in the card and a second antenna located in the reader. For developing, storing and processing the information, a chip is placed inside the card on a support on which it is connected to a screen printed antenna. Hybrid contact-contactless smart cards also exists which can operate as traditional smart cards or as contactless smart cards. These cards feature an electronic module consisting of a chip and a double-sided circuit, one side of which has contact surfaces that are flush with the surface of one of the faces of the card body.

A number of manufacturing processes exist for hybrid or contactless smart cards. A first type of card is a monobloc card in which the antenna support is inserted between two layers made of plastic material (PVC, PET, PC, acrylonitrile-butadiene-styrene (ABS) . . . ) forming the upper and lower card bodies and then heat bonded by hot-lamination under pressure. The module is connected to the antenna by an electrically conductive glue or equivalent which enables the ohmic contact to be established.

This type of card features a high overall stiffness. As a result, when the card is subjected to mechanical bending and/or twisting stresses, the latter are immediately transmitted to the chip and primarily to the bonding spots which make the chip/antenna or module/antenna connections. These stresses, applied intentionally or unintentionally, may cause connections to break and thus may result in card malfunction without the card being marked.

This characteristic proves to be the major disadvantage for hybrid or contactless smart cards. It is, in fact, relatively easy for a dishonest user to destroy the card as cleanly as possible by intensive bending. When the card is sold with a credit (telephone cards, mass transit cards, highway toll station cards) and this credit is exhausted or almost exhausted, this allows the individual to have the card exchanged or reimbursed by the card issuer without it being possible to prove the intent to fraud afterwards.

In order to offset this major drawback, screen-printing the antenna on a paper-type fibrous material, and placing it between two card bodies made of at least one layer of plastic material has been considered. A hot-lamination under pressure step enables the various layers to be welded together, the fluidified PVC of one of the card bodies trapping the screen printed ink of the antenna.

The paper support has the advantage of giving the card the ability to delaminate when bent at the location where the forces are generated by said bending, which highlights any act of deliberate damage a posteriori as the card retains the traces of the bending.

However, this type of card has a drawback as the connection of the electronic module is weak. Indeed, if the paper antenna support offers the advantage of "memorizing" the bends of the card, the card lacks internal cohesion favoring delamination of the paper after multiple bending under the glue joint(s) that hold the module onto the card and at the thinner part of the card body, thereby resulting in disconnection of the electronic module and the antenna.

This is why the object of the invention is to provide a hybrid or contactless smart card with an antenna support made of a fibrous, paper-type material featuring a reinforced connection of the module in order to withstand disconnection and pulling out in case of intensive bending.

Another object of the invention it to provide a contactless smart card with reinforced connection of the electronic module, simply by contact between the chip and the antenna without using conductive glue.

The purpose of the invention is thus a contactless or hybrid contact-contactless smart card including an antenna on a support made of fibrous, paper-type material, two card bodies on each side of the support each consisting of at least one layer of plastic material having a relatively low flow temperature, and an electronic module featuring a chip connected to the antenna, the assembly formed by the antenna support and the two card bodies being welded together by hot-lamination under pressure. The support made of fibrous material includes at least one opening such that the plastic layers of the card body come into near perfect contact owing to the opening during the lamination operation, the opening thus forming a weld between the card bodies thus reinforcing the connection of the module.

Figure 2:
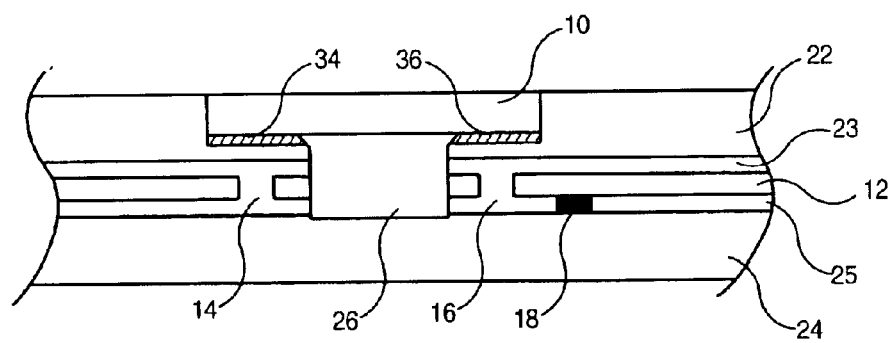

The purposes, objects and characteristics of the invention will become more apparent from the following description when taken in conjunction with the accompanying drawings in which:

FIG. 1 represents the antenna support of a hybrid contact—contactless smart card according to the invention, FIG. 2 represents a cross sectional view of the smart card, represented in FIG. 1, along the axis A—A.

Figure 3:
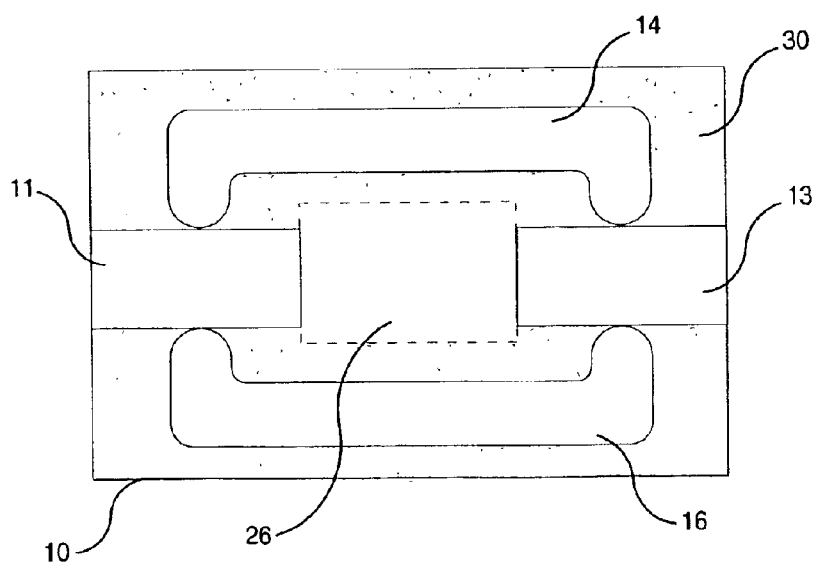
Figure 4:
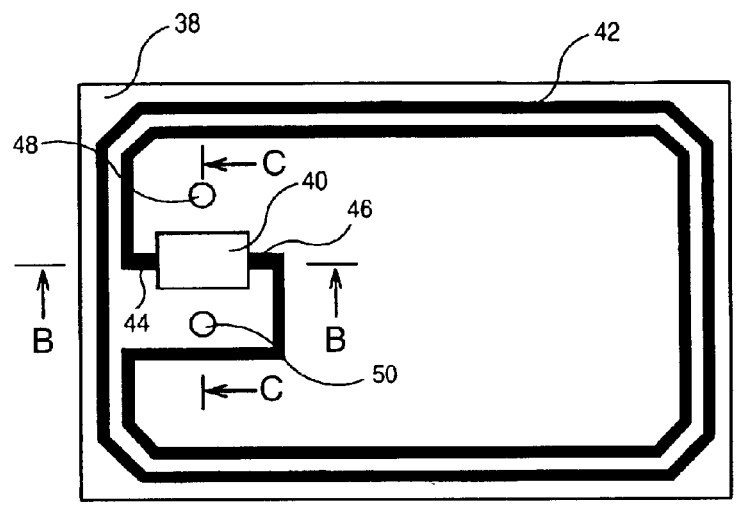
Figure 5:
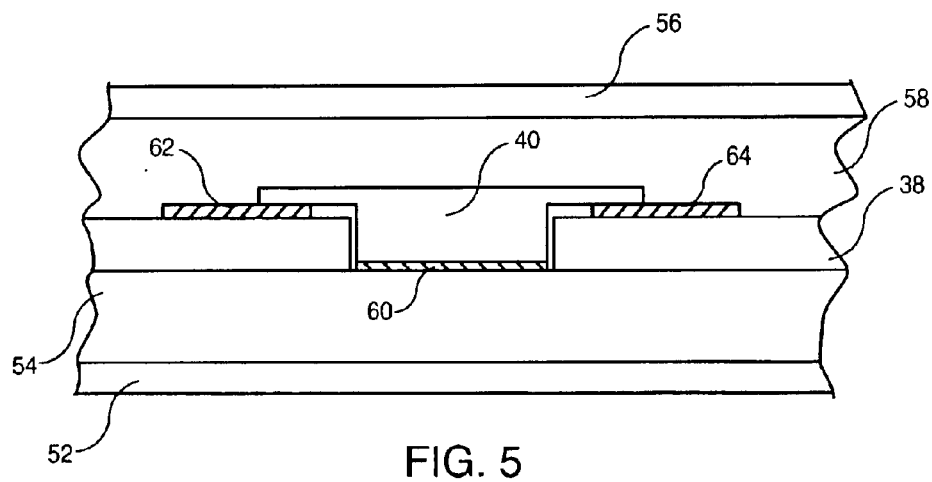
Figure 6:
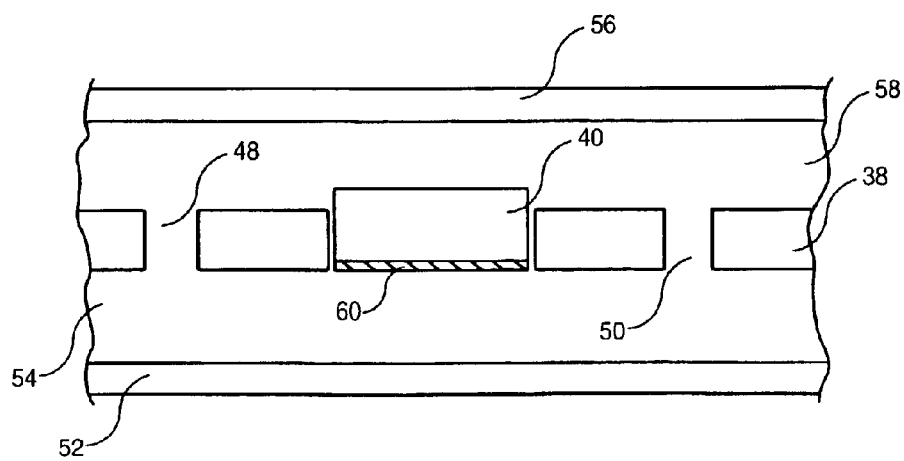

FIG. 3 is a front view of the openings and the location of the module in the antenna support for the card represented in FIG. 1, FIG. 4 represents the antenna support of a contactless smart card according to the invention, FIG. 5 represents a cross sectional view of the smart card, represented in FIG. 4, along the axis B—B, and FIG. 6 represents a cross sectional view of the smart card, represented in FIG. 4, along the axis C—C.

The hybrid contact-contactless smart card features an electronic module consisting of an electronic chip and a double-sided circuit 10, one face of which is flush with one of the faces of the card. The card's antenna, generally screen-printed on a support made of fibrous material 12 includes a number of turns 18 made of conductive ink and two contacts 11 and 13 designed to be connected to the chip, and thus to the electronic module. The antenna support features two openings 14 and 16 which are preferably made after the antenna screen-printing operation. The shape of the openings as well as their location are described in detail in the description that follows.

According to FIG. 2, representing a cross section along axis A—A of a part of the card shown in FIG. 1, the card consists of several layers throughout its thickness. In a preferred embodiment, the antenna support 12 is inserted between a lower card body, made up of layers 22 and 23, and an upper card body, made up of layers 24 and 25. The upper and lower card bodies are made of plastic material of polyvinyl chloride (PVC) or polyester (PET, PETG) or polycarbonate (PC) type or even acrylonitrile-butadiene-styrene (ABS). According to a preferred embodiment, the card bodies are made of PVC and each consist of an external layer of rigid PVC 22 or 24 and an internal soft PVC layer 23 or 25. The PVC making up the soft PVC layer, in contact with the antenna, has a Vicat point (the temperature at which the PVC shifts from a rigid state to a rubbery state) less than the Vicat point of the layer forming the rigid PVC layer.

The assembly of the card layers is made using a hot-lamination process at a specific temperature and under pressure. Under the combined action of heat and pressure, the external PVC only softens while the internal layer, made of PVC having a lower Vicat point, fluidifies. The fluidified PVC of layer 25 traps the antenna in the mass, and enters into near perfect contact with the fluidified PVC of layer 23 through the openings 14 and 16 made previously in the antenna support 12, thus creating two welds between the upper and lower card bodies via the near perfect contact of the two internal layers 23 and 25.

After assembly of the various layers which make up the card, a cavity is pierced in the card, generally by a milling operation, in order to house the electronic module made up of the electronic chip 26 and the double-sided circuit 10. The shape of the cavity is such that it includes a smaller central part designed to receive the chip 26 and an larger external part made in a part of the thickness of layer 22 of the card body in order to receive the double-sided circuit.

The electronic module is inserted into the cavity and secured by bonding in the larger part of the cavity. In this manner, the double-sided circuit of the electronic module and the external layer 22 of the card body are linked together by two spots of cyanoacrylate type glue 34 and 36, placed over openings 14 and 16 previously made in the antenna support 12. The spots of glue 34 and 36 are thus positioned at the location where the thickness of the card body 22 is the least and thus are located at openings 14 and 16 filled with PVC and forming two welds between the upper and lower card bodies, thereby reinforcing the connection of the module on its support.

The connection of the chip to the antenna contacts 11 and 13 is ensured by the use of conductive glue, not represented in the figure, and applied before the electronic module is inserted into its cavity.

According to FIG. 3, the location of the openings 14 and 16 on the antenna support are placed on either side of the contacts 11 and 13 and preferably in the middle of the face 30 of the double-sided circuit 10 intended to be glued onto the card and represented in the figure. However, the openings may be slightly off-set in relation to the position, shown in the figure while remaining superposed on the face 30 of the electronic module without deviating from the scope of the invention. In all cases, the width of the openings must not be excessive. In this respect, the surface area of the openings must not exceed the surface area of the face 30 of the module to be glued so that the openings are totally filled with the fluidified PVC of layers 23 and 25 during the lamination operation of the card bodies.

As the electronic module is placed symmetrically on either side of the contacts 11 and 13, the openings 14 and 16 are preferably symmetrical in relation to the contacts 11 and 13 and are preferably identical in shape. In addition, in order to improve the connection of the module on the card, the outside contour of openings 14 and 16 matches the outside contour of the glue spots 34 and 36 as much as possible.

When the invention is applied to a contactless smart card, the antenna support 38 is presented as shown in FIG. 4. As seen previously, the electronic module 40 is connected to an antenna 42 which is screen printed on support 38 by two contacts 44 and 46. The antenna support also features two openings 48 and 50 which are preferably made after the antenna screen-printing operation.

According to FIG. 5 representing the cross section along axis B—B of the card shown in FIG. 4, the contactless card consists of several layers. In a preferred embodiment, the antenna support 38 is inserted between a lower card body made up of layers 52 and 54, and an upper card body made up of layers 56 and 58. As in the previous case, the card bodies are made of PVC, polyester, polycarbonate or acrylonitrile-butadiene-styrene (ABS). As above, each of the external layers 52, 58, preferably made of PVC, is rigid whereas each of the internal layers 54, 58 is preferably made of soft PVC. These layers in contact with the antenna support 38 have a Vicat point which is lower than the Vicat point of the external layers made of rigid PVC. As can be seen in the figure, the external layers are thinner than the internal layers contrary to the hybrid card in which the external layers are generally thicker than the internal layers.

The electronic module 40 is placed in an opening of the support 38 and secured to the layer 54 of the lower card body by a layer of glue 60. The chip's contacts (not shown) are thus in contact with the antenna contacts 62 and 64. The ohmic connection may be made using conductive glue or without glue by means of a simple contact as explained below.

If we consider the cross section of the support along axis C—C, represented in FIG. 6, the two openings 48 and 50 which are located in the antenna support 38 on each side of the module 40 can be seen.

As above, the layers are assembled by a hot-laminating process and under pressure. Under the combined action of heat and pressure, the outer layer of PVC 52 or 56 softens while the inner layer 54 or 58 fluidifies. The fluidified PVC of layer 58 traps the antenna in the mass and enters into near perfect contact with the fluidified PVC of layer 54 via the openings 48 and 50. This creates two welds between the upper and lower card bodies by the near perfect contact of the two internal layers 54 and 58.

Unlike the electric module of the hybrid contact-contactless smart card, the electric module of the contactless card is trapped between the two bodies of the card. Owing to the hot-lamination process which enables the welds of the two layers to be made through the openings 48 and 50 as presented above, the pressure exerted by the module on the contacts 62 and 64 of the antenna is maintained after the lamination step. This pressure thus enables the ohmic contact between the chip and the antenna to take place without it being necessary to provide a layer of conductive glue between the chip's contacts and those of the antenna.

As previously, the openings may be more or less distant from the module without being excessively far from it such that the connection of the module is reinforced. The size of the openings must not be too small so as to ensure a strong link between the two internal layers of the card bodies. The openings are preferably placed symmetrically in relation to the module and are preferably of the same shape. While in the embodiment illustrated in FIGS. 4 and 6, the openings are circular in shape, any other shape may be used without deviating from the scope of the invention.

Whether for a contactless card or for a hybrid card, the openings must not have sharp corners, for several reasons. Openings without sharp corners facilitates the cut-out operation. Indeed, cutting out openings with sharp corners may create points which retain the paper to be removed on its support, while cutting out openings with rounded corners never present this type of problem. In addition, when the card body is printed with solid colors, the cut-outs are exposed during the lamination operation due to the ink dots which are located above the openings getting closer together, resulting in a darker color at the location of the openings. As a result, a rounded shape seen through the transparent PVC is more aesthetic than a shape with sharp corners.

Although it is preferable to have two openings on each side of the module to reinforce its connection as described above, it is possible to have only one opening, or more than two openings, without deviating from the scope of the invention.

What is claimed is:

1. A smart card comprising
   an antenna on a support made of fibrous material,
   two card bodies one on each side of said support, each card body comprising at least one layer of plastic material having a low flow temperature, and
   an electronic module housed in a cavity formed in one of said card bodies,
   wherein said antenna support has a chip connected to the antenna,
   the assembly formed by the antenna support and the two card bodies being welded together by hot-lamination under pressure;
   wherein said support includes at least one opening such that the plastic layers of said card bodies come into near perfect contact through said opening during the lamination process, said opening thus filled forming a weld between the card bodies.

2. The smart card of claim 1, in which the chip of said electronic module is connected to the antenna by two contacts on said antenna support, the latter featuring two openings on each side of said contacts.

3. The smart card of claim 2, in which said two openings are identical in shape and are symmetrical in relation to the contacts.

4. The smart card of claim 3, in which said openings are round in shape.

5. The smart card of claim 1, in which said electronic module is placed in a cavity of the antenna support before hot-lamination under pressure and is secured to one of said card bodies by a layer of non-conductive glue.

6. The smart card of claim 5, in which the chip of said electronic module is connected to said antenna by means of two contacts via simple ohmic contact without conductive glue, said ohmic contact being made by pressure between the layers of said card bodies in near perfect contact through said openings forming a weld after hot-lamination.

7. The smart card of claim 5, in which said antenna support features two openings located on each side of said electronic module.

8. The smart card of claim 7, in which said openings are symmetrical in relation to said electronic module.

9. The smart card of claim 1, wherein said fibrous material comprises paper.

* * * * *